(12) United States Patent
Takeuchi et al.

(10) Patent No.: US 9,385,511 B2
(45) Date of Patent: Jul. 5, 2016

(54) SPARK PLUG

(71) Applicant: NGK SPARK PLUG CO., LTD., Nagoya-shi, Aichi (JP)

(72) Inventors: Hiroki Takeuchi, Aichi (JP); Yutaka Yokoyama, Komaki (JP); Kuniharu Tanaka, Komaki (JP); Takeshi Mitsuoka, Kounan (JP); Toshitaka Honda, Nagoya (JP); Hirokazu Kurono, Nagoya (JP); Katsuya Takaoka, Ichinomiya (JP); Hironori Uegaki, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 14/420,819

(22) PCT Filed: Aug. 23, 2013

(86) PCT No.: PCT/JP2013/004973
§ 371 (c)(1),
(2) Date: Feb. 10, 2015

(87) PCT Pub. No.: WO2014/034055
PCT Pub. Date: Mar. 6, 2014

(65) Prior Publication Data
US 2015/0207300 A1    Jul. 23, 2015

(30) Foreign Application Priority Data

Aug. 28, 2012 (JP) ................. 2012-187262

(51) Int. Cl.
*C04B 35/10* (2006.01)
*H01T 13/38* (2006.01)
(Continued)

(52) U.S. Cl.
CPC ............... *H01T 13/38* (2013.01); *C04B 35/10* (2013.01); *C04B 35/111* (2013.01);
(Continued)

(58) Field of Classification Search
CPC ........ C03B 35/10; C03B 35/111; H01T 13/38
See application file for complete search history.

(56) References Cited

U.S. PATENT DOCUMENTS

| 8,614,542 B2 * | 12/2013 | Walker | ................. C04B 35/111 313/130 |
| 9,136,031 B2 * | 9/2015 | Ito | ...................... H01L 21/6833 |

(Continued)

FOREIGN PATENT DOCUMENTS

| CN | 102365798 A | 2/2012 |
| JP | 2001-313148 A | 11/2001 |

(Continued)

OTHER PUBLICATIONS

International Search Report of PCT/JP2013/004973, dated Sep. 17, 2013. [PCT/ISA/210].

(Continued)

*Primary Examiner* — Karl Group
(74) *Attorney, Agent, or Firm* — Sughrue Mion, PLLC

(57) ABSTRACT

A spark plug including an insulator containing an Al component, in terms of oxides, 89 mass % or more and a Ti component, in terms of oxides, more than 0 mass % and 0.2 mass % or less, characterized in that the insulator is formed of an alumina-based sintered material which contains, in a grain boundary phase present between alumina crystal grains, a first crystal phase containing at least one species selected from among an La component, an Nd component, a Pr component, a Y component, an Er component, a Yb component, and an Lu component, and a second crystal phase containing at least one species of Group 2 element components, an Al component and an Si component.

4 Claims, 2 Drawing Sheets

(51) Int. Cl.
*C04B 35/111* (2006.01)
*H01T 13/60* (2011.01)
*G01R 31/12* (2006.01)
*G01R 31/14* (2006.01)

(52) U.S. Cl.
CPC .......... *C04B 2235/3201* (2013.01); *C04B 2235/3206* (2013.01); *C04B 2235/3208* (2013.01); *C04B 2235/3213* (2013.01); *C04B 2235/3215* (2013.01); *C04B 2235/3222* (2013.01); *C04B 2235/3224* (2013.01); *C04B 2235/3225* (2013.01); *C04B 2235/3227* (2013.01); *C04B 2235/3232* (2013.01); *C04B 2235/3418* (2013.01); *C04B 2235/3481* (2013.01); *C04B 2235/80* (2013.01); *C04B 2235/85* (2013.01); *G01R 31/12* (2013.01); *G01R 31/14* (2013.01); *H01T 13/60* (2013.01)

(56) References Cited

U.S. PATENT DOCUMENTS 9,160,145 B2 * 10/2015 Takaoka .................. H01T 13/38

2010/0229813 A1  9/2010 Ogata et al.
2011/0077141 A1  3/2011 Walker et al.
2012/0007489 A1  1/2012 Kurono et al.
2012/0176022 A1  7/2012 Nakagawa et al.

FOREIGN PATENT DOCUMENTS

JP      4613242    B2   1/2011
JP      2011-70929 A    4/2011
JP      5017298    B2   9/2012

OTHER PUBLICATIONS

Communication dated Sep. 21, 2015 from the State Intellectual Property Office of the P.R. of China issued in corresponding Chinese application No. 201380034914.3.

* cited by examiner

SPARK PLUG

CROSS REFERENCE TO RELATED APPLICATIONS

This application is a National Stage of International Application No. PCT/JP2013/004973 filed Aug. 23, 2013, claiming priority based on Japanese Patent Application No. 2012-187262, filed Aug. 28, 2012, the contents of all of which are incorporated herein by reference in their entirety.

TECHNICAL FIELD

The present invention relates to a spark plug and, more particularly, to a spark plug having a specific insulator.

BACKGROUND ART

Spark plugs for use in internal combustion engines such as automobile engines have a spark plug insulator (may be referred to simply as "insulator" in the specification) formed from, for example, alumina-based sintered material, containing alumina ($Al_2O_3$) as a predominant component. The insulator is formed from such an alumina-based sintered material, since the alumina-based sintered material is excellent in heat resistance, mechanical strength, or the like. The alumina-based sintered material is formed by sintering a powder mixture containing a sintering aid including $SiO_2$, MgO, or the like.

However, when a spark plug insulator formed from an alumina-based sintered material produced by sintering with a sintering aid, after sintering, the sintering aid may remain present to form a low-melting-point glass phase at a grain boundary of alumina crystal grains after sintering. In such a case, the low-melting-point glass phase is softened under high-temperature operation conditions of a spark plug; e.g., at about 700° C., possibly impairing withstand voltage characteristics of the insulator thereof.

Meanwhile, spark plugs have become to be employed not only with fossil fuels such as gasoline but also with a variety of fuels including biofuels (e.g., ethanol). Under such circumstances, spark plugs are operated in an acidic atmosphere or in a basic atmosphere and therefore, are required to have corrosion resistance to such an atmosphere.

Patent Document 1 discloses an invention whose object is to provide "a spark plug which is excellent in resistance to an acidic atmosphere (hereinafter may be referred to as acid resistance) and withstand voltage characteristics at high temperature" (paragraph: 0008). A characteristic feature of the spark plug disclosed in Document 1 resides in that the insulator of the spark plug "is formed of an alumina-based sintered material containing an Si component, a Ba component, a Ca component, and an Mg component so as to satisfy the following conditions (1) and (2), and substantially containing no B component" (claim 1). Condition 1 is as follows: the ratio $R_{Ca}$ of the mass of the Ca component (as reduced to oxide) to the mass of the Si component (as reduced to oxide) is 0.05 to 0.40. Condition 2 is as follows: the ratio $R_{Mg}$ of the mass of the Mg component (as reduced to oxide) to the sum of the mass of the mass of the Si component (as reduced to oxide), the mass of the Ca component (as reduced to oxide), and the mass of the Mg component (as reduced to oxide) is 0.01 to 0.08.

Patent Document 1 discloses that the spark plug has excellent resistance to an acidic atmosphere, but is silent on the resistance to a basic atmosphere.

PRIOR ART DOCUMENTS

Patent Documents

Patent Document 1: Japanese Patent Application Laid-Open (kokai) No. 2011-70929

SUMMARY OF THE INVENTION

Problems to be Solved by the Invention

An object of the present invention is to provide a spark plug which exhibits excellent withstand voltage characteristics at high temperature and high resistance to an acidic atmosphere and a basic atmosphere.

Means for Solving the Problems

Means (1) for attaining the aforementioned object is a spark plug having an insulator containing an Al component in an amount as reduced to oxide (hereinafter referred to as oxide-reduced amount) of 89 mass % or more and a Ti component in an oxide-reduced amount more than 0 mass % and 0.2 mass % or less, characterized in that the insulator is formed of an alumina-based sintered material which contains, in a grain boundary phase present between alumina crystal grains, a first crystal phase containing at least one species selected from among an La component, an Nd component, a Pr component, a Y component, an Er component, a Yb component, and an Lu component, and a second crystal phase containing at least one species of Group 2 element components, the Group included in the periodic table defined by Recommendations 1990, IUPAC, an Al component, and an Si component.

In a preferred embodiment (2) of (1) above, when a cross section of the insulator is analyzed through X-ray diffractometry, the alumina crystal grains have a maximum diffraction peak height a, the first crystal phase has a maximum diffraction peak height b, and the second crystal phase has a maximum diffraction peak height c, wherein a, b, and c satisfy the following relationship (a):

$$0.025 \leq (b+c)/a \leq 0.12 \quad \text{(a)}.$$

In another preferred embodiment (3) of the spark plug as described in (1) or (2) above, the first crystal phase is $MgRE^1Al_{11}O_{19}$, $RE^1Al_{11}O_{18}$, $RE^2{}_2Si_2O_7$, $RE^2AlO_3$, and/or $RE^2{}_3Al_5O_{12}$ (wherein $RE^1$ represents at least one species selected from among La, Nd, and Pr; and $RE^2$ represents at least one species selected from among Y, Er, Yb, and Lu), and the second crystal phase is $CaAl_2Si_2O_8$.

In still another preferred embodiment (4) of the spark plug as described in any of (1) to (3) above, the insulator contains substantially no Na component or K component, or contains the Na component and the K component in an oxide-reduced total amount of 0.2 mass % or less.

Effects of the Invention

The spark plug of the present invention has an insulator formed of an alumina-based sintered material which contains an Al component and a Ti component at specific compositional proportions, and in a grain boundary phase present between alumina crystal grains, the first crystal phase and the second crystal phase. Therefore, the spark plug provided by the present invention exhibits excellent withstand voltage characteristics at high temperature and has resistance to an acidic atmosphere and a basic atmosphere.

When a cross section of the insulator is analyzed through X-ray diffractometry, in the case where the ratio of the sum of the maximum diffraction peak height b of the first crystal phase and the maximum diffraction peak height c of the second crystal phase to the maximum diffraction peak height a of the alumina crystal grains falls within a specific range, withstand voltage characteristics at high temperature and resistance to an acidic atmosphere and a basic atmosphere can be further enhanced.

The insulator contains substantially no Na component or K component. If the Na component and the K component are contained, the oxide-reduced total amount thereof is 0.2 mass % or less. Thus, crystallization of the first crystal phase and the second crystal phase included in the grain boundary phase can be promoted, whereby withstand voltage characteristics at high temperature and resistance to an acidic atmosphere and a basic atmosphere can be further enhanced.

MODE FOR CARRYING OUT THE INVENTION

The spark plug according to the present invention essentially has an insulator satisfying the aforementioned conditions. For example, the spark plug includes a center electrode, a generally cylindrical insulator surrounding the center electrode and satisfying the aforementioned conditions, and a ground electrode disposed such that one end of the ground electrode faces the center electrode via a spark discharge gap. So long as the spark plug has an insulator satisfying the aforementioned conditions, no particular limitation is imposed on the remaining structure of the spark plug of the invention, and any of various known structures may be employed.

Figure 1:
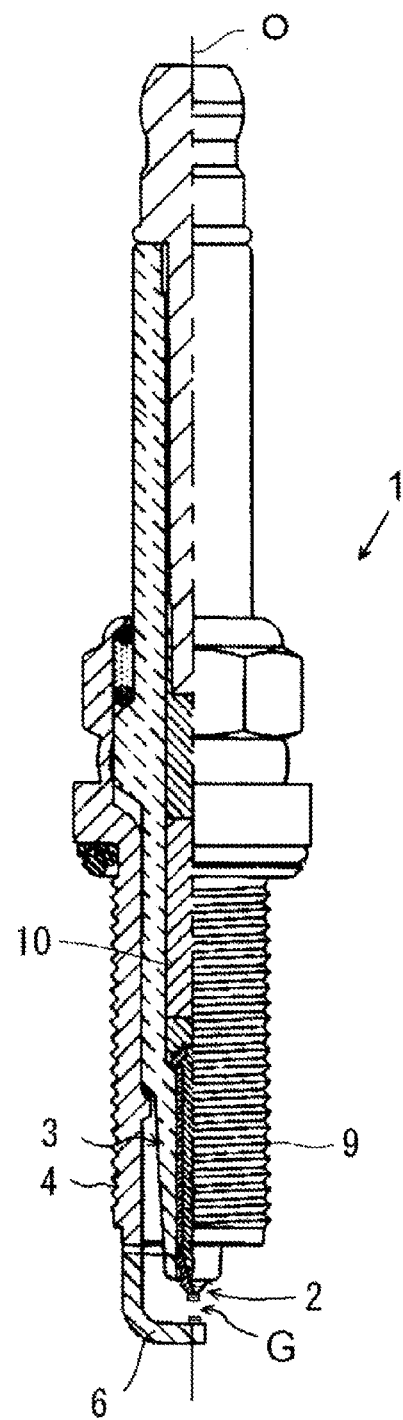
FIG. 1 is a partially-sectioned overall view showing a spark plug which is one example of the spark plug according to the present invention.

Hereinafter, with reference to FIG. 1, the spark plug according to the present invention, and the insulator, which is an essential member of the spark plug, will be described. FIG. 1 is a partially-sectioned overall view of the spark plug 1 which is one example of the spark plug according to the present invention. In the following description, the lower side of FIG. 1 will be referred to as the forward end side with respect to the direction of an axis O, and the upper side of FIG. 1 will be referred to as the rear end side with respect to the direction of the axis O.

As shown in FIG. 1, the spark plug 1 includes a generally rod-shaped center electrode 2; a generally cylindrical insulator 3 surrounding the center electrode 2; a cylindrical metallic shell 4 holding the insulator 3; and a ground electrode 6. One end of the ground electrode 6 is disposed to face the forward end surface of the center electrode 2 via a spark discharge gap G, and the other end of the ground electrode 6 is joined to the metallic shell 4.

The metallic shell 4 has a cylindrical shape, and holds the insulator 3 inserted thereinto. A screw portion 9 is formed on the outer circumferential surface of a forward end portion of the metallic shell 4. The spark plug 1 is attached to the cylinder head of an unillustrated internal combustion engine by making use of the screw portion 9. The metallic shell 4 may be formed of an electrically conductive steel material, such as low carbon steel. Examples of the standard of the screw portion 9 include M10, M12, and M14. In the present invention, the nominal diameter of screw portion 9 refers to a value defined in ISO2705 (M12), ISO2704 (M10), and the like. Needless to say, variance in nominal diameter may be acceptable, so long as the variance falls within size tolerances stipulated in such standards.

The center electrode 2 assumes a generally rod-like body extending in the axis O direction. The center electrode 2 is fixed to the insulator 3 such that its forward end portion projects from the forward end surface of the insulator 3, whereby the center electrode 2 is held by the metallic shell 4 and is insulated therefrom. The center electrode 2 may be formed of a Ni-based alloy or the like, which is excellent in heat resistance and corrosion resistance.

The ground electrode 6 has, for example, a prismatic shape. One end of the ground electrode 6 is joined to the end surface of the metallic shell 4, and is bent into a generally L-like shape. The shape and configuration of the ground electrode 6 are designed such that a distal end portion of the ground electrode 6 is aligned with the axis O of the center electrode 2. Since the ground electrode 6 is designed in this manner, the other end of the ground electrode 6 faces the center electrode 2 via the spark discharge gap G. The spark discharge gap G is a gap between the forward end surface of the center electrode 2 and the surface of the ground electrode 6, and is generally set to 0.3 to 1.5 mm. Since the ground electrode 6 is exposed to a higher temperature, as compared with the center electrode 2, preferably, the ground electrode 6 is formed of an Ni-based alloy or the like which is more excellent than the Ni-based alloy of the center electrode 2 in terms of heat resistance corrosion resistance, etc.

The insulator 3 is formed of the below-described alumina-based sintered material into a generally cylindrical shape, and has an axial hole 10 for holding the center electrode 2 along the axis O of the insulator 3. The insulator 3 is held or fixed by an inner circumferential portion of the metallic shell 4 by the mediation of talc and/or packing or the like, such that a forward end portion of the insulator 3 projects from the forward end surface 4a of the metallic shell 4.

Next, the alumina-based sintered material, which forms the insulator 3 of the spark plug 1 and which is a characteristic feature of the invention, will be described in detail. The alumina-based sintered material contains an Al component, a Ti component, an Si component, at least one species selected from among Group 2 element components, and at least one species selected from among RE components (RE components: an La component, an Nd component, a Pr component, a Y component, an Er component, a Yb component, and an Lu component), and the below-described first crystal phase and second crystal phase in a grain boundary phase present between alumina crystal grains. As used herein, the term "grain boundary phase" refers to a crystalline or amorphous material (hereinafter may be referred to as glass) other than alumina crystals which phase is present between alumina crystal grains.

The alumina-based sintered material has an Al component content is 89 mass % or higher as reduced to oxide ($Al_2O_3$), preferably 91 mass % or higher, when the total mass of the alumina-based sintered material (as reduced to oxide) is 100 mass %. The upper limit of the Al component content may be less than 100 mass %, but is preferably 97 mass % or less for preventing reduction in sinterability and increase in production cost and attaining excellent withstand voltage characteristics. The Al component is present mainly as alumina ($Al_2O_3$) and is also present as the below-mentioned first crystal phase or second crystal phase. When the alumina-based sintered material contains the Al component in the aforementioned amount, withstand voltage characteristics, heat resistance, mechanical strength, and the like of the material can be enhanced.

The alumina-based sintered material has a Ti component whose content is higher than 0 mass % and 0.2 mass % or lower as reduced to oxide ($TiO_2$), more preferably 0.005 mass % to 0.10 mass %, when the total mass of the alumina-based sintered material (as reduced to oxide) is 100 mass %. The Ti component is present in the form of oxide, ion, etc. in the alumina-based sintered material. The components to be added to serve as the below-mentioned sintering aids, for example, the Si component, the Group 2 element component, and the RE component melt during sintering, to thereby serve as sintering aids. After completion of sintering, these components readily form glass or the like between alumina crystal grains. However, when the Ti component is incorporated in the aforementioned amount, the Ti component works as a nucleating agent and promotes crystallization of the components serving as sintering aids, whereby the below-mentioned first crystal phase and second crystal phase are readily formed in a grain boundary phase.

When the first crystal phase and second crystal phase are present in the grain boundary phase, the insulator formed of the alumina-based sintered material exhibits excellent withstand voltage characteristics at high temperature and has resistance to an acidic atmosphere and a basic atmosphere. Through formation of the first crystal phase and second crystal phase prior to glass in the grain boundary phase, the amount of glass, which is a material having poor acid resistance and base resistance, relatively decreases, whereby corrosion is inhibited. In contrast, when the first crystal phase and second crystal phase, which are a material having high acid resistance and base resistance, are formed in the grain boundary phase, conceivably, crystals exhibiting high acid resistance in an acidic atmosphere and crystal exhibiting high base resistance in a basic atmosphere inhibit corrosion, whereby a drop in strength of the insulator is prevented. If no Ti component is contained, the effect of the nucleating agent cannot be attained. In this case, difficulty is encountered in formation of the first crystal phase and second crystal phase, and the amount of glass relatively increases, resulting in poor resistance to an acidic atmosphere and a basic atmosphere. When the Ti component content is in excess of 0.2 mass %, the Ti component becomes to have a semiconductor-like characteristic at high temperature, to thereby impair withstand voltage characteristics at high temperature.

The alumina-based sintered material contains at least one species selected from among the RE components. The RE components include an La component, an Nd component, a Pr component, a Y component, an Er component, a Yb component, and an Lu component. The RE components originate from the sintering aid and are present in the form of oxide, ion, etc. in the alumina-based sintered material. In order to enhance withstand voltage characteristics at high temperature and resistance to an acidic atmosphere and a basic atmosphere, the oxide-reduced RE component content is preferably 0.5 mass % to 6.0 mass %, when the total mass of the alumina-based sintered material (as reduced to oxide) is 100 mass %.

The RE components, which are present in the alumina-based sintered material during sintering, suppress excessive growth of alumina grains during sintering. A part of the RE components are crystallized with the Al component, the Si component, or the like, and are present as crystals in the grain boundary phase. Another part of the RE components remain as elements forming the glass present in the grain boundary phase. The glass containing the aforementioned RE component has high melting temperature. Thus, as compared with a low-melting-point containing no RE component, withstand voltage characteristics of the alumina-based sintered material at high temperature can be enhanced. In addition, with the aid of the Ti component serving as a nucleating agent, the RE component forms the first crystal phase having acid resistance and/or base resistance, synergistic with the Al component, the Si component, and/or the Group 2 element component, or the like. Through formation of the first crystal phase in a grain boundary phase present between alumina crystal grains, the amount of glass formed in the grain boundary phase relatively decreases. Instead, the first crystal phase having acid resistance and/or base resistance is formed. As a result, there can be prevented corrosion, which would otherwise be caused from the causal points of the glass present in the grain boundary phase, when the spark plug is exposed to an acidic atmosphere or a basic atmosphere.

The alumina-based sintered material contains the Si component. The Si component originates from the sintering aid employed in sintering and is present in the form of oxide, ion, etc. in the alumina-based sintered material. The Si component melts during sintering, to generally form a liquid phase. That is, the Si component serves as a sintering aid promoting the densification of the formed sintered material. After completion of sintering, the Si component generally forms a low-melting-point glass or the like at the grain boundary phase formed of alumina crystal grains. However, the alumina-based sintered material contains, in addition to the Si component, the Ti component as a nucleating agent as well as the RE components, the Group 2 component, and the like. Thus, the Si component tends to preferentially form the below-mentioned first crystal phase, the second crystal phase, and the like with other components, rather than low-melting-point glass.

The alumina-based sintered material contains at least one species of the Group 2 element components (hereinafter may be referred to as Group 2 components). The Group 2 element components originate from the sintering aid employed in sintering and may include at least one element of the Group 2 elements in the periodic table defined by Recommendations 1990, IUPAC. From the viewpoint of availability, an Mg component, a Ca component, an Sr component, and a Ba component are preferred. The Group 2 component are present in the form of oxide, ion, etc. in the alumina-based sintered material. Similar to the Si component before sintering, the Group 2 components serve as a sintering aid, and, after sintering, form the below-mentioned second crystal phase with glass and an Al component, an Si component, or the like, in the grain boundary phase. Through formation of the second crystal phase in a grain boundary phase present between alumina crystal grains, the amount of glass formed in the grain boundary phase relatively decreases. Instead, the second crystal phase having acid resistance and/or base resistance is formed. As a result, there can be prevented corrosion, which would otherwise be caused from the causal points of the glass present in the grain boundary phase, when the spark plug is exposed to an acidic atmosphere or a basic atmosphere.

The first crystal phase is formed of crystals containing, as essential ingredients, at least one species selected from among an La component, an Nd component, a Pr component, a Y component, an Er component, a Yb component, and an Lu component. The first crystal phase has acid resistance and/or base resistance. The first crystal phase may further contain, in addition to the aforementioned components, an Al component, a Group 2 component, or an Si component. Examples of the first crystal phase include $MgRE^1Al_{11}O_{19}$, $RE^1Al_{11}O_{18}$, $RE^2_2Si_2O_7$, $RE^2AlO_3$, $RE^2_3Al_5O_{12}$, and $RE^2_4Al_2O_9$ (wherein $RE^1$ represents at least one species selected from among La, Nd, and Pr; and $RE^2$ represents at least one species selected from among Y, Er, Yb, and Lu). The first crystal phase may be formed of one or more members of these. Among them, $MgRE^1Al_{11}O_{19}$, $RE^1Al_{11}O_{18}$, $RE^2_2Si_2O_7$, $RE^2AlO_3$, and $RE^2_3Al_5O_{12}$ are preferred, since they enhance acid resistance and base resistance when they are co-present with the below-mentioned second crystal phase.

The second crystal phase is formed of at least one species of Group 2 element components, the Group included in the periodic table defined by Recommendations 1990, IUPAC, an Al component, and an Si component. The second crystal phase has acid resistance and/or base resistance. Examples of the second crystal phase include $CaAl_2Si_2O_8$, $SrAl_2Si_2O_8$, and $BaAl_2Si_2O_8$. The second crystal phase may be formed of one or more members of these. Among them, $CaAl_2Si_2O_8$ is preferred, since it enhances acid resistance and base resistance when it is co-present with the first crystal phase.

Since the alumina-based sintered material contains the first crystal phase and the second crystal phase, in a grain boundary phase present between a plurality of alumina crystal grains, corrosion of the material is prevented when it is exposed to an acidic atmosphere or a basic atmosphere, whereby impairment in strength of the material is prevented. A certain limitation is imposed on the crystals formed in the rain boundary phase, since there are some crystals having poor acid resistance or basic resistance in the crystals. Through deposition of high-acid-resistant crystals and high-base-resistant crystals in the grain boundary phase, the insulator produced from the alumina-based sintered material exhibits resistance to an acidic atmosphere and a basic atmosphere. It cannot be predicted which crystal in the first crystal phase or the second crystal phase has acid resistance or base resistance. However, through incorporation of the first crystal phase and the second crystal phase into the grain boundary phase, the insulator produced from the alumina-based sintered material exhibits resistance to an acidic atmosphere and a basic atmosphere.

Preferably, the alumina-based sintered material contains no Na component or K component, or contains the Na component and the K component in a total amount (as reduced to oxide: $Na_2O$ or $K_2O$) of 0.2 mass % or less, when the total mass of the alumina-based sintered material (as reduced to oxide) is 100 mass %. In other words, preferably, the alumina-based sintered material contains substantially no Na component or K component. In the case where the alumina-based sintered material contains an Na component or a K component, the maximum total amount is preferably 0.2 mass %. In one case, the Na component and K component may be incorporated into an alumina raw material as an unavoidable impurity. In another case, the Na component and K component may be incorporated into a binder for molding which is added to a raw material of the alumina-based sintered material when the raw material is molded. However, when the Na component or K component is present, the Si component, the Group 2 component, the RE component, and the like are readily vitrified after sintering, and difficulty may be encountered in formation of the first crystal phase and the second crystal phase in the grain boundary phase. Therefore, the total amount of the Na component and the K component is preferably regulated to 0.2 mass % or less.

When a cross section of the insulator 3 is analyzed through X-ray diffractometry, the alumina crystal grains have a maximum diffraction peak height a, the first crystal phase has a maximum diffraction peak height b, and the second crystal phase has a maximum diffraction peak height c, wherein a, b, and c preferably satisfy the following relationship (a):

$$0.025 \leq (b+c)/a \leq 0.12 \qquad \text{(a)}.$$

When the alumina-based sintered material satisfies the relationship (a), the spark plug produced therefrom exhibit further enhanced withstand voltage characteristics at high temperature and further enhanced resistance to an acidic atmosphere and a basic atmosphere.

The aforementioned relationship (a) provides a general index for the ratio of the first crystal phase content or the second crystal phase content with respect to the amount of alumina crystals. When the (b+c)/a is less than 0.025; i.e., when the first crystal phase content or the second crystal phase content with respect to the amount of alumina crystals is small, in one case, crystallization in the grain boundary phase does not sufficiently proceed, and small amounts of crystals having acid resistance or base resistance are deposited. In another case, the amount of the Si component, the Group 2 component, the RE component, or the like added as a sintering aid is insufficient. In the former case, resistance to an acidic atmosphere and a basic atmosphere tends to be poor. In the latter case, sinterability tends to be poor due to insufficient amount of sintering aid, and withstand voltage characteristics tend to be poor. When the (b+c)/a is more than 0.12, the amount of alumina crystals with respect to the first crystal phase content or the second crystal phase content is small, and withstand voltage characteristics tend to be poor.

The maximum heights a, b, and c may be determined in the following manner. Firstly, any cross section of the insulator 3 is subjected to X-ray diffractometry, to thereby obtain an X-ray diffraction chart. Through comparison of the thus-obtained X-ray diffraction chart with the JCPDS cards, which are data of diffraction profiles of standard substances, the crystals contained in the alumina-based sintered material are identified. The peak height of the most intense diffraction peak among a plurality of diffraction lines of the alumina crystals is measured, and the value is employed as the maximum height a.

The maximum height b is determined in the same manner as employed for determining the maximum height a. Specifically, the peak height of the most intense diffraction peak among a plurality of diffraction lines of the first crystal phase containing at least one species selected from among the RE components. In the case where the first crystal phase includes a plurality of crystal phases; e.g., $Y_2Si_2O_7$ and $YAlO_3$, the peak height b1 of the most intense diffraction peak among a plurality of diffraction lines of $Y_2Si_2O_7$, and the peak height b2 of the most intense diffraction peak among a plurality of diffraction lines of $YAlO_3$ are determined, and the sum (b1+b2) is employed as the maximum height b.

The maximum height c is determined in the same manner as employed for determining the maximum height a. Specifically, the peak height of the most intense diffraction peak among a plurality of diffraction lines of the second crystal phase containing at least one species the Group 2 components, the Al component, and the Si component is determined. In the case where the second crystal phase includes a plurality of crystal phases, the sum of the respective peak heights is employed as the maximum height c, similar to the case of the maximum height b. In determination of any peak height, a background is subtracted.

In some cases, no data is found in the JCPDS cards regarding a Pr component and an Nd component. Such a component cannot be directly identified through X-ray diffractometry. However, since the ionic radius of $Pr^{3+}$ and that of $Nd^{3+}$ are almost equivalent to that of $La^{3+}$, a first crystal phase containing a Pr component or an Nd component exhibits an X-ray diffraction spectrum similar to that of a first crystal phase containing an La component shown in the JCPDS card thereof. Thus, the presence of a first crystal phase containing a Pr component or an Nd component can be identified with reference to the JCPDS card of a hexaaluminate crystal containing an La component.

In the present invention, the Al component content, the Ti component content, or the like of the alumina-based sintered material may be determined as an oxide-reduced mass or an oxide-reduced mass % through, for example, fluorescent X-ray spectrometry or ICP analysis. Specifically, a component of the alumina-based sintered material other than the Ti component may be determined through fluorescent X-ray spectrometry, and the Ti component may be determined through ICP analysis. Notably, in the present invention, the measurements obtained through fluorescent X-ray spectrometry or ICP analysis of the alumina-based sintered material generally coincide with the proportions of raw material powders for producing the alumina-based sintered material. Thus, each component content may be adjusted on the basis of the relative amount of a raw material powder.

The alumina-based sintered material is substantially composed of at least one species selected from among the RE components, at least one species selected from among the Group 2 components, the Al component, the Ti component, and the Si component. As used herein, the term "substantially" refers to that an additional component other than the aforementioned components is not intentionally added. Notably, since each of the above components may contain a microamount of impurities, the alumina-based sintered material may further contain, in addition to these components, any impurities, so long as the scope of the present invention is not impaired. Examples of such impurities which may be present in the alumina-based sintered material include Na, K, and Fe. The amounts of the impurities are preferably small. For example, the oxide-reduced total amount of the Na component and the K component is preferably 0.2 parts by mass or less, with respect to the 100 parts by mass of the oxide reduced mass of the Al component, the Ti component, the RE components, the Group 2 components, and the Si component, and other components. The total impurity mass is preferably 0.5 parts by mass or less. Also, the alumina-based sintered material may further contain, in addition to the aforementioned impurities, a small amount of another component; e.g., a rare earth component other than the RE components (e.g., Dy or Eu), so long as the scope of the present invention is not impaired.

Next, the method for producing a spark plug 1, which is an example of the spark plug according to the present invention, will be described in detail. The following is steps for producing an insulator. Firstly, raw material powders of main components; i.e., an Al compound, a Ti compound, an Si compound, a Group 2 element compound, the Group included in the periodic table defined by Recommendations 1990, IUPAC (hereinafter may be referred to as Group 2 compound), and RE element compounds (RE elements: La, Nd, Pr, Y, Er, Yb, and Lu) are employed. the powders are mixed with a binder and a solvent, to thereby prepare a slurry. If needed, additives such as a plasticizer, a defoaming agent, and a dispersant may be added.

The raw material powders are preferably mixed for 8 hours or longer, so that the uniform raw material is formed, and the formed sintered product has high density.

No particular limitation is imposed on the Al compound powder, so long as it is a powder of a compound which forms $Al_2O_3$ firing. Generally, alumina ($Al_2O_3$) powder is employed. Actually, Al compound powder might contain unavoidable impurities (e.g., Na component). Therefore, the Al compound powder preferably has high purity, for example, 99.5% or higher. In order to yield a high-density alumina-based sintered material, generally, an Al compound powder having a mean particle size of 0.1 µm to 5.0 µm is preferably employed. The mean particle size is determined through the laser diffraction method (Microtrac particle size distribution measuring apparatus (MT-3000), product of Nikkiso Co., Ltd.). Preferably, the Al compound powder is prepared such that the Al oxide content, with respect to 100 mass % of the total mass (as reduced to oxide) of the alumina-based sintered material after firing, is adjusted to 89 mass % to 97 mass %, from the viewpoint of excellent withstand voltage characteristics.

No particular limitation is imposed on the Ti compound powder, so long as it is a powder of a compound which can form Ti oxide through firing. Examples of the Ti compound include inorganic powders of Ti oxide, Ti complex oxide, Ti hydroxide, Ti carbonate, Ti chloride, Ti sulfate, and Ti nitrate, and powder of a natural mineral. When a Ti compound powder other than Ti oxide powder is employed, the amount of the powder is controlled by the unit of its oxide-reduced mass %. The purity and mean particle size of the ti compound powder are generally the same as those of the Al compound powder. Preferably, the Ti compound powder is prepared such that the Ti oxide content, with respect to 100 mass % of the total mass (as reduced to oxide) of the alumina-based sintered material after firing, is adjusted to more than 0 mass % and 0.2 mass % or less.

No particular limitation is imposed on the Si compound powder, so long as it is a powder of a compound which can form Si oxide through firing. Examples of the Si compound powder include inorganic powders of Si oxide, Si complex oxide, Si hydroxide, Si carbonate, Si chloride, Si sulfate, and Si nitrate, and powder of a natural mineral. When an Si compound powder other than silicon oxide powder is employed, the amount of the powder is controlled by the unit of its oxide-reduced mass %. The purity and mean particle size of the Si compound powder are generally the same as those of the Al compound powder.

No particular limitation is imposed on the Group 2 compound powder, so long as it is a powder of a compound which can form a Group 2 element oxide through firing. Examples of the Group 2 compound powder include inorganic powders of Group 2 element oxide, Group 2 element complex oxide, Group 2 element hydroxide, Group 2 element carbonate, Group 2 element chloride, Group 2 element sulfate, and Group 2 element nitrate, and powder of a natural mineral. When a Group 2 compound powder other than Group 2 element oxide powder is employed, the amount of the powder is controlled by the unit of its oxide-reduced mass %. The purity and mean particle size of the Group 2 compound powder are generally the same as those of the Al compound powder.

No particular limitation is imposed on the RE element compound powder, so long as it is a powder of a compound which can form an RE element oxide through firing. Examples powders of the RE element compound include RE element oxide powder, RE element complex oxide, and RE element hydroxide. The purity and mean particle size of the RE element compound powder are generally the same as those of the Al compound powder. Preferably, the RE element compound powder is prepared such that the RE element oxide content, with respect to 100 mass % of the total mass (as reduced to oxide) of the alumina-based sintered material after firing, is adjusted to 0.5 mass % to 6.0 mass %.

The binder can enhance moldability of the raw material powders. An example of such a binder is a hydrophilic binder. Examples of the hydrophilic binder include polyvinyl alcohol, water-soluble acrylic resin, gum arabic, and dextrin. These binders may be used singly or in combination of two or more species. The binder used in the invention preferably has a low Na component content and a low K component content, so as not to inhibit crystallization of the first crystal phase and the second crystal phase. The amount of the binder with respect to 100 parts by mass of the raw material powder is preferably 0.1 to 7 parts by mass, particularly preferably 1.0 to 5.0 parts by mass.

The solvent can disperse the raw material powders. Examples of the solvent include water and alcohol. These solvents may be used singly or in combination of two or more species. The amount of the solvent binder with respect to 100 parts by mass of the raw material powder is preferably 40 to 120 parts by mass, particularly preferably 50 to 100 parts by mass.

The thus-produced slurry is spray dried through, for example, a spray drying method or the like, to thereby form a spherical granulated product. The granulated product preferably has a mean particle size of 30 to 200 μm, particularly preferably 50 to 150 μm. The mean particle size is determined through the laser diffraction method (Microtrac particle size distribution measuring apparatus (MT-3000), product of Nikkiso Co., Ltd.).

Subsequently, the granulated product is press-molded through, for example, rubber pressing or metal mold pressing, to thereby yield a green mold. The outer surface of the thus-obtained green mold is polished by means of resinoid grind stone or the like, to thereby work the green mold to a desired shape.

The thus-polished finished green compact having a desired shape is fired in air at 1,450 to 1,650° C. for 1 to 8 hours, and cooled to 1,200° C. at a cooling rate of 5 to 30° C./min, followed by allowing to cool to ambient temperature, to thereby yield an alumina-based sintered material. When the firing temperature is 1,450 to 1,650° C., the sintered material tends to have sufficient density, and anomalous grain growth of the alumina component is prevented, whereby the produced alumina-based sintered material reliably has excellent withstand voltage characteristics and mechanical strength. Also, when the firing time is 1 to 8 hours, the sintered material tends to have sufficient density, and anomalous grain growth of the alumina component is prevented, whereby the produced alumina-based sintered material reliably has excellent withstand voltage characteristics and mechanical strength. When the cooling rate from the firing temperature to 1,200° C. is 5 to 30° C./min, the Si compound powder, the Group 2 compound powder, the RE element compound powder, and the like, which have been added as sintering aids, are readily crystallized, to thereby facilitate deposition of the first crystal phase and the second crystal phase in the grain boundary phase. As a result, an alumina-based sintered material having excellent withstand voltage characteristics and resistance to an acidic atmosphere and a basic atmosphere can be produced.

If needed, the shape and related properties of the thus-produced alumina-based sintered material may be modified again. Through the aforementioned procedure, the alumina-based sintered material can be produced. The insulator 3 of the spark plug 1 made of the alumina-based sintered material can be produced.

Separately, an electrode material such as an Ni-base alloy is worked to a specific shape having specific dimensions, to thereby form the center electrode 2 and the ground electrode 6. Subsequently, one end of the ground electrode 6 is joined, through electric resistance welding or a similar technique, to the end surface of the metallic shell 4 formed through plastic working or the like to a shape of interest. Then, the center electrode 2 is integrated to the insulator 3 through a known technique. The insulator 3 is integrated into the metallic shell 4 to which the ground electrode 6 has been joined. Then, the forward end portion of the ground electrode 6 is bent toward the center electrode 2 so that one end of the ground electrode 6 faces the forward end portion of the center electrode 2, whereby the spark plug 1 is produced.

The spark plug 1 is employed as a spark plug of an automotive internal combustion engine such as a gasoline engine. In use, the screw portion is fixed to a predetermined position of a head which defines a combustion chamber of the internal combustion engine (not illustrated) by screwing the portion with an internal thread provided therethrough. Since the spark plug 1 has the aforementioned insulator, the spark plug exhibits excellent withstand voltage characteristics and mechanical strength, at ambient temperature and high temperature, and has resistance to an acidic atmosphere and a basic atmosphere. Therefore, the spark plug 1 can be employed in any type of internal combustion engines. Specifically, the spark plug can be suitably employed in a conventional internal combustion engine, and also in an internal combustion or the like whose combustion chamber is readily exposed to an acidic atmosphere and/or a basic atmosphere.

The spark plug of the present invention is not limited to the aforementioned embodiment and may be modified in a variety of manners, so long as the object of the present invention can be attained.

Examples

1. Production and Evaluation of Alumina-Based Sintered Materials

Production of Alumina-Based Sintered Materials

The following raw material powders were used: alumina ($Al_2O_3$) powder having a mean particle size of 0.2 to 2.1 μm, a titanium compound (Ti oxide) powder, an Si compound ($SiO_2$) powder, a Group 2 element compound (carbonate of Ca, Mg, Sr, or Ba) powder, and an RE element compound (shown in TABLE 1) powder. In each case, these powders were mixed with polyvinyl alcohol serving as a binder and water serving as a solvent, to thereby prepare a slurry.

The thus-obtained slurry was dried through spray drying or a similar technique, to thereby prepare a granulated product having a mean spherical particle size of about 100 μm. Then, the granulated product was press-molded, to thereby yield a disk-shape green compact. The green compact was fired at 1,450° C. to 1,650° C. in air for 2 to 8 hours as shown in TABLE 2 and then cooled from the firing temperature to 1,200° C. at an average cooling rate of 5 to 200° C./min, followed by allowing the compact to cool to ambient temperature, to thereby yield a disk-shape alumina-based sintered member having a diameter of 18 mm and a thickness of 0.3 to 0.5 mm.

(Determination of Component Content)

The compositional proportions (i.e., component contents) of the thus-produced alumina-based sintered material were determined. The amount of a component of the alumina-based sintered material other than the Ti component was determined through fluorescent X-ray spectrometry, and the amount of the Ti component was quantitated through ICP analysis. Each of the thus-determined component contents was a relative amount (%) of the component to the total amount of the oxides of all the components as 100 mass %. As a result, the component proportions shown in TABLE 1 and the measurements (component contents) obtained through the component analysis of the alumina-based sintered members generally coincided with the proportions of raw material powders.

(Presence of First Crystal Phase and Second Crystal Phase)

A cut surface of each alumina-based sintered member was polished, and the polished surface was subjected to X-ray diffractometry by means of an X-ray diffractometer (model: MiniFLex, product of Rigaku) under the following conditions: X-ray, CuKα ($\lambda$=1.54 Å); scanning speed, 4°/min; sampling width, 0.020°; and divergence slit width, 1 mm. Through comparison of the thus-obtained X-ray diffraction chart with the JCPDS cards, the presence of the first crystal phase, the second crystal phase, and other crystal phases was confirmed in the grain boundary phase of each alumina-based sintered member, as shown in TABLE 1.

(Withstand Voltage Test)

Figure 2:
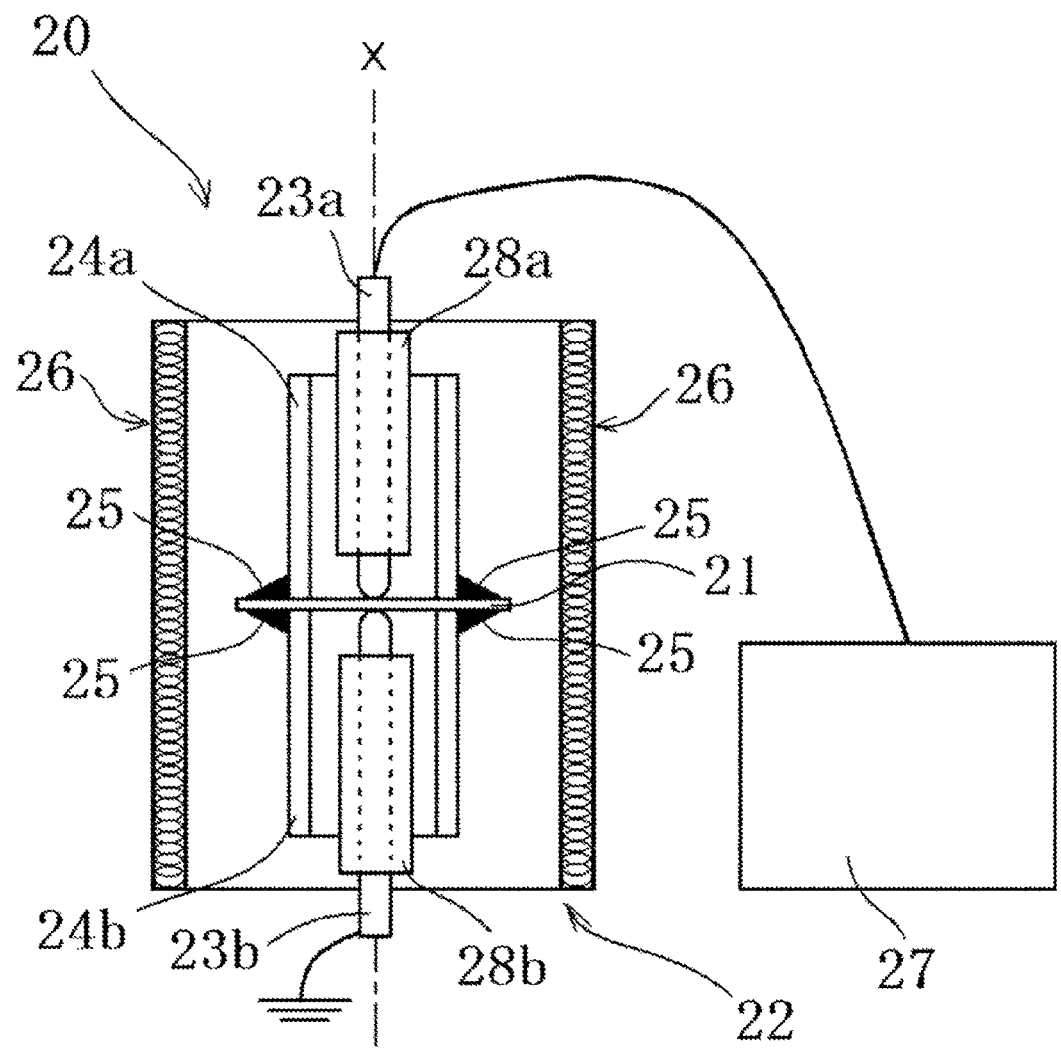
FIG. 2 is an schematic view showing a withstand voltage measuring apparatus employed for determining withstand voltage characteristics in the Examples.

Withstand voltage of each alumina-based sintered member was measured at 700° C. by means of a withstand voltage measuring apparatus 20 shown in FIG. 2. As shown in FIG. 2, the withstand voltage measuring apparatus 20 has a heating box 22. In the heating box 22, a disk-shape alumina-based sintered member 21 is supported in the direction of axis X by means of alumina ceramic cylinders 24a, 24b, which surround the electrodes 23a, 23b. The contact portion between one surface of the alumina-based sintered member 21 and the alumina ceramic cylinder 24a, and that between the other surface of the member 21 and the alumina ceramic cylinder 24b are sealed along the entire periphery thereof with an $SiO_2$-based sealing glass 25. The diameter of each of the electrodes 23a, 23b is gradually reduced toward the end of the electrode, which is in contact with the alumina-based sintered member 21. That is, the end of each electrode assumes the shape of a hemi-sphere. In order to prevent generation of electric discharge between the electrodes 23a, 23b and the heating box 22, the peripheral surfaces of the electrodes 23a, 23b are covered with the corresponding alumina ceramic cylinders 28a, 28b. By means of the withstand voltage measuring apparatus 20, a predetermined high voltage was applied to the alumina-based sintered member 21 in the heating box 22 whose temperature was regulated to 700° C. by means of an electric heater 26. The high voltage was generated by a high-voltage generator 27 that can apply a voltage as high as some tens of kilovolts to the alumina-based sintered member 21. The voltage at which dielectric breakdown occurred in the alumina-based sintered member 21 was measured and was divided by the thickness of the breakthrough portion of the alumina-based sintered member. The ratio was employed as the "withstand voltage" of the alumina-based sintered material 21. TABLE 2 shows withstand voltage values determined at 700° C.

(Acid Resistance Test and Base Resistance Test)

Similar to the aforementioned alumina-based sintered members, test pieces each having the same structure and dimensions (thickness of 3 mm, width of 4 mm, and full length of 40 to 45 mm) were produced. The thus-produced alumina-based sintered members (test pieces) were subjected to "Acid and alkali corrosion test of fine ceramics" defied by JIS R1614. Mechanical strength of each alumina-based sintered member was measured before and after the corrosion test, and acid resistance or base resistance was evaluated on the basis of a drop in mechanical strength. In the acid resistance test of the corrosion test, a test piece was immersed in 6N sulfuric acid and boiled for 24 hours. In the base resistance test of the corrosion test, a test piece was immersed in 6N aqueous sodium hydroxide and boiled for 24 hours. After the corrosion test, each test piece was washed and dried, and bending strength S2 of the test piece was determined in accordance with JIS R 1601. Bending strength S1 of the test piece before corrosion test was similarly determined. From the bending strength values S2 and S1, percent strength drop ((S1−S2)/S1×100)(%) was calculated. TABLE 2 shows the results.

(Evaluation)

As described above, alumina-based sintered members were subjected to the withstand voltage test, acid resistance test, and base resistance test. In the withstand voltage test, a with stand voltage of 60 kV/mm or higher was rated with "A," that of 50 kV/mm or higher and lower than 60 kV/mm was rated with "O," and that lower than 50 kV/mm was rated with "X." In the acid resistance test, an acid resistance of 40% or less was rated with "A," that more than 40% and 49% or less was rated with "O," and that more than 49% was rated with "X." In the base resistance test, a base resistance of 30% or less was rated with "A," that more than 30% and 33% or less was rated with "O," and that more than 33% was rated with "X." In general evaluation, the case where at least one rating of the three ratings was "X" was rated with "X," the case where three ratings were "O" was rated with "O," and the case where three ratings were "O" or more excellent and at least one rating was "A" was rated with "A."

TABLE 1

| | ALUMINA-BASED SINTERED MATERIAL COMPOSITION (OXIDE-REDUCED MASS %) | | | | | | | | | | | | CRYSTAL PHASE | | | X-RAY PEAK RATIO |
|---|---|---|---|---|---|---|---|---|---|---|---|---|---|---|---|---|
| | | | | | | | | RE | AS | | | | | | | (b + |
| | $Al_2O_3$ | $SiO_2$ | CaO | MgO | SrO | BaO | POWDER | $RE_2O_3$ | $Na_2O$ | $K_2O$ | $TiO_2$ | 1ST | 2ND | OTHER | c)/a |
| COMP. EX. 1 | 94.47 | 2.73 | 2.00 | 0.10 | | 0.20 | | | 0.50 | | | — | — | — | — |
| COMP. EX. 2 | 94.47 | 2.73 | 2.00 | 0.10 | | 0.20 | | | | 0.50 | | — | — | — | — |
| COMP. EX. 3 | 94.47 | 2.73 | 2.00 | 0.10 | | 0.20 | | | 0.50 | | | — | — | — | — |
| COMP. EX. 4 | 94.47 | 2.73 | 2.00 | 0.10 | | 0.20 | | | | 0.50 | | — | — | — | — |
| COMP. EX. 5 | 94.34 | 2.90 | 0.42 | 1.30 | | 1.04 | | | | | | — | $CaAl_2Si_2O_8$ | MgO | 0.020 |
| COMP. EX. 6 | 92.95 | 3.10 | 0.05 | 1.30 | | 0.10 | $YAlO_3$ | 2.50 | | | | $YAlO_3$ | | MgO | 0.020 |

TABLE 1-continued

| | ALUMINA-BASED SINTERED MATERIAL COMPOSITION (OXIDE-REDUCED MASS %) | | | | | | | | | | | CRYSTAL PHASE | | | X-RAY PEAK RATIO |
|---|---|---|---|---|---|---|---|---|---|---|---|---|---|---|---|
| | | | | | | | RE | | AS | | | | | | |
| | $Al_2O_3$ | $SiO_2$ | CaO | MgO | SrO | BaO | POWDER | $RE_2O_3$ | $Na_2O$ | $K_2O$ | $TiO_2$ | 1ST | 2ND | OTHER | (b + c)/a |
| COMP. EX. 7 | 93.34 | 2.90 | 0.42 | 0.30 | | 1.04 | $La_2O_3$ | 2.00 | | | | — | — | | — |
| COMP. EX. 8 | 92.72 | 3.10 | 0.50 | 0.28 | | 0.90 | $YAlO_3$ | 2.50 | | | | — | — | | — |
| COMP. EX. 9 | 85.75 | 5.75 | 1.25 | 0.70 | | 2.25 | $La_2O_3$ | 4.00 | | | 0.30 | $MgLaAl_{11}O_{19}$ | $CaAl_2Si_2O_8$ | | 0.150 |
| COMP. EX. 10 | 85.50 | 7.00 | 2.00 | 0.30 | | 0.90 | $YAlO_3$ | 4.00 | | | 0.30 | $YAlO_3$ | $BaAl_2Si_2O_8$ | | 0.150 |
| EX. 1 | 92.65 | 2.90 | 0.10 | 0.40 | 1.50 | 0.20 | $La_2O_3$ | 2.20 | | | 0.05 | $MgLaAl_{11}O_{19}$ | $SrAl_2Si_2O_8$ | | 0.059 |
| EX. 2 | 92.85 | 2.90 | 0.10 | 0.40 | | 1.50 | | 2.20 | | | 0.05 | $MgLaAl_{11}O_{19}$ | $BaAl_2Si_2O_8$ | | 0.065 |
| EX. 3 | 92.81 | 3.10 | 0.50 | 0.28 | | 0.90 | | 2.20 | 0.10 | 0.10 | 0.01 | $MgLaAl_{11}O_{19}$ | $CaAl_2Si_2O_8$ | | 0.025 |
| EX. 4 | 92.97 | 3.10 | 0.50 | 0.28 | | 0.90 | | 2.20 | | | 0.05 | $MgLaAl_{11}O_{19}$ | $CaAl_2Si_2O_8$ | | 0.060 |
| EX. 5 | 93.71 | 2.80 | 0.56 | 0.28 | | 1.00 | | 1.60 | | | 0.05 | $MgLaAl_{11}O_{19}$ | $CaAl_2Si_2O_8$ | | 0.035 |
| EX. 6 | 93.24 | 2.90 | 0.42 | 0.30 | | 1.04 | | 2.00 | | | 0.10 | $MgLaAl_{11}O_{19}$ | $CaAl_2Si_2O_8$ | | 0.075 |
| EX. 7 | 93.35 | 3.00 | 0.46 | 0.24 | | 1.10 | | 1.80 | | | 0.05 | $MgLaAl_{11}O_{19}$ | $CaAl_2Si_2O_8$ | | 0.058 |
| EX. 8 | 92.58 | 3.20 | 0.48 | 0.30 | | 0.84 | | 2.40 | | | 0.20 | $MgLaAl_{11}O_{19}$ | $CaAl_2Si_2O_8$ | | 0.100 |
| EX. 9 | 93.98 | 2.90 | 0.52 | 0.25 | | 0.94 | | 1.40 | | | 0.01 | $MgLaAl_{11}O_{19}$ | $CaAl_2Si_2O_8$ | | 0.025 |
| EX. 10 | 89.75 | 4.53 | 0.73 | 0.41 | | 1.32 | | 3.21 | | | 0.05 | $MgLaAl_{11}O_{19}$ | $CaAl_2Si_2O_8$ | | 0.088 |
| EX. 11 | 92.97 | 3.10 | 0.50 | 0.28 | | 0.90 | $Nd_2O_3$ | 2.20 | | | 0.05 | $MgNdAl_{11}O_{19}$ | $CaAl_2Si_2O_8$ | | 0.065 |
| EX. 12 | 92.97 | 3.10 | 0.50 | 0.28 | | 0.90 | $Pr_2O_3$ | 2.20 | | | 0.05 | $MgPrAl_{11}O_{19}$ | $CaAl_2Si_2O_8$ | | 0.067 |
| EX. 13 | 93.25 | 3.10 | 0.50 | 0.00 | | 0.90 | $La_2O_3$ | 2.20 | | | 0.05 | $LaAl_{11}O_{18}$ | $CaAl_2Si_2O_8$ | | 0.064 |
| EX. 14 | 96.25 | 1.86 | 0.30 | 0.17 | | 0.54 | | 0.83 | | | 0.05 | $MgLaAl_{11}O_{19}$ | $CaAl_2Si_2O_8$ | | 0.040 |
| EX. 15 | 93.29 | 2.90 | 0.42 | 0.30 | | 1.04 | | 2.00 | | | 0.05 | $MgLaAl_{11}O_{19}$ | $CaAl_2Si_2O_8$ | | 0.040 |
| EX. 16 | 91.09 | 2.90 | 0.42 | 2.30 | | 1.04 | | 2.20 | | | 0.05 | $MgLaAl_{11}O_{19}$ | $CaAl_2Si_2O_8$ | | 0.130 |
| EX. 17 | 92.17 | 3.60 | 0.50 | 0.28 | | 0.90 | $Y_4Al_2O_9$ | 2.50 | | | 0.05 | $Y_4Al_2O_9$ | $CaAl_2Si_2O_8$ | | 0.080 |
| EX. 18 | 92.67 | 3.10 | 0.10 | 0.28 | | 1.30 | $YAlO3$ | 2.50 | | | 0.05 | $YAlO_3$ | $BaAl_2Si_2O_8$ | | 0.080 |
| EX. 19 | 92.67 | 3.10 | 0.50 | 0.28 | | 0.90 | | 2.50 | | | 0.05 | $YAlO_3$ | $CaAl_2Si_2O_8$ | | 0.070 |
| EX. 20 | 92.67 | 3.10 | 0.10 | 0.28 | 1.30 | | | 2.50 | | | 0.05 | $YAlO_3$ | $SrAl_2Si_2O_8$ | | 0.075 |
| EX. 21 | 89.20 | 4.20 | 0.65 | 0.80 | | 1.25 | | 3.50 | | | 0.20 | $YAlO_3$ | $CaAl_2Si_2O_8$ | | 0.120 |
| EX. 22 | 92.51 | 3.10 | 0.50 | 0.28 | | 0.90 | | 2.50 | 0.10 | 0.10 | 0.01 | $YAlO_3$ | $CaAl_2Si_2O_8$ | | 0.025 |
| EX. 23 | 96.49 | 2.20 | 0.30 | 0.10 | | 0.30 | | 0.60 | | | 0.01 | $YAlO_3$ | $CaAl_2Si_2O_8$ | | 0.036 |
| EX. 24 | 92.67 | 3.10 | 0.50 | 0.28 | | 0.90 | $Y_3Al_5O_{12}$ | 2.50 | | | 0.05 | $Y_3Al_5O_{12}$ | $CaAl_2Si_2O_8$ | | 0.080 |
| EX. 25 | 92.17 | 3.60 | 0.50 | 0.28 | | 0.90 | $Y_2Si_2O_7$ | 2.50 | | | 0.05 | $Y_2Si_2O_7$ | $CaAl_2Si_2O_8$ | | 0.068 |
| EX. 26 | 92.67 | 3.10 | 0.50 | 0.28 | | 0.90 | $ErAlO_3$ | 2.50 | | | 0.05 | $ErAlO_3$ | $CaAl_2Si_2O_8$ | | 0.080 |
| EX. 27 | 92.67 | 3.10 | 0.50 | 0.28 | | 0.90 | $Er_3Al_5O_{12}$ | 2.50 | | | 0.05 | $Er_3Al_5O_{12}$ | $CaAl_2Si_2O_8$ | | 0.062 |
| EX. 28 | 92.67 | 3.10 | 0.50 | 0.28 | | 0.90 | $Er_2Si_2O_7$ | 2.50 | | | 0.05 | $Er_2Si_2O_7$ | $CaAl_2Si_2O_8$ | | 0.063 |
| EX. 29 | 92.67 | 3.10 | 0.50 | 0.28 | | 0.90 | $YbAlO_3$ | 2.50 | | | 0.05 | $YbAlO_3$ | $CaAl_2Si_2O_8$ | | 0.080 |
| EX. 30 | 92.67 | 3.10 | 0.50 | 0.28 | | 0.90 | $Yb_3Al_5O_{12}$ | 2.50 | | | 0.05 | $Yb_3Al_5O_{12}$ | $CaAl_2Si_2O_8$ | | 0.070 |
| EX. 31 | 92.67 | 3.10 | 0.50 | 0.28 | | 0.90 | $Yb_2Si_2O_7$ | 2.50 | | | 0.05 | $Yb_2Si_2O_7$ | $CaAl_2Si_2O_8$ | | 0.072 |
| EX. 32 | 92.67 | 3.10 | 0.50 | 0.28 | | 0.90 | $LuAlO_3$ | 2.50 | | | 0.05 | $LuAlO_3$ | $CaAl_2Si_2O_8$ | | 0.060 |
| EX. 33 | 92.67 | 3.10 | 0.50 | 0.28 | | 0.90 | $Lu_3Al_5O_{12}$ | 2.50 | | | 0.05 | $Lu_3Al_5O_{12}$ | $CaAl_2Si_2O_8$ | | 0.092 |
| EX. 34 | 92.67 | 3.10 | 0.50 | 0.28 | | 0.90 | $Lu_2Si_2O_7$ | 2.50 | | | 0.05 | $Lu_2Si_2O_7$ | $CaAl_2Si_2O_8$ | | 0.090 |
| EX. 35 | 92.67 | 3.10 | 0.50 | 0.28 | | 0.90 | $YAlO_3$ | 2.50 | | | 0.05 | $YAlO_3$ | $CaAl_2Si_2O_8$ | | 0.058 |
| EX. 36 | 91.97 | 3.10 | 0.50 | 2.28 | | 0.90 | | 1.20 | | | 0.05 | $YAlO_3$ | $CaAl_2Si_2O_8$ | | 0.130 |

TABLE 2

| | FIRING CONDITIONS | | | TEST RESULTS (SCORES) 700° C. | | | | | | | |
|---|---|---|---|---|---|---|---|---|---|---|---|
| | TEMP. (° C.) | TIME (hr) | COOLING RATE (° C./min) | WITHSTAND VOLTAGE (kV/mm) | | ACID TEST STRENGTH DROP (%) | | BASE TEST STRENGTH DROP (%) | | GENERAL EVALUA- TION | |
| COMP. EX. 1 | 1500 | 2 | 15 | 32 | X | 55 | X | 38 | X | X | |
| COMP. EX. 2 | 1500 | 2 | 15 | 38 | X | 54 | X | 36 | X | X | |
| COMP. EX. 3 | 1550 | 2 | 15 | 33 | X | 55 | X | 36 | X | X | |
| COMP. EX. 4 | 1550 | 2 | 15 | 37 | X | 55 | X | 37 | X | X | |
| COMP. EX. 5 | 1500 | 2 | 15 | 45 | X | 50 | X | 35 | X | X | |
| COMP. EX. 6 | 1650 | 2 | 15 | 49 | X | 50 | X | 34 | X | X | |
| COMP. EX. 7 | 1500 | 2 | 200 | 63 | A | 56 | X | 35 | X | X | |
| COMP. EX. 8 | 1550 | 2 | 200 | 61 | A | 57 | X | 37 | X | X | |
| COMP. EX. 9 | 1500 | 2 | 5 | 38 | X | 48 | O | 34 | X | X | |
| COMP. EX. 10 | 1550 | 2 | 5 | 49 | X | 45 | O | 34 | X | X | |
| EX. 1 | 1550 | 2 | 5 | 58 | O | 42 | O | 31 | O | O | |
| EX. 2 | 1650 | 2 | 5 | 58 | O | 43 | O | 31 | O | O | |
| EX. 3 | 1550 | 2 | 5 | 55 | O | 40 | A | 32 | O | A | |
| EX. 4 | 1550 | 2 | 5 | 62 | A | 35 | A | 27 | A | A | |

TABLE 2-continued

| | FIRING CONDITIONS | | | TEST RESULTS (SCORES) 700° C. | | | | | | |
|---|---|---|---|---|---|---|---|---|---|---|
| | TEMP. (° C.) | TIME (hr) | COOLING RATE (° C./min) | WITHSTAND VOLTAGE (kV/mm) | | ACID TEST STRENGTH DROP (%) | | BASE TEST STRENGTH DROP (%) | | GENERAL EVALUATION |
| EX. 5 | 1550 | 1 | 5 | 68 | A | 38 | A | 29 | A | A |
| EX. 6 | 1550 | 2 | 5 | 65 | A | 36 | A | 27 | A | A |
| EX. 7 | 1550 | 2 | 5 | 63 | A | 37 | A | 28 | A | A |
| EX. 8 | 1600 | 2 | 5 | 60 | A | 35 | A | 26 | A | A |
| EX. 9 | 1550 | 4 | 5 | 65 | A | 38 | A | 29 | A | A |
| EX. 10 | 1450 | 8 | 5 | 60 | A | 40 | A | 30 | A | A |
| EX. 11 | 1550 | 2 | 5 | 65 | A | 38 | A | 27 | A | A |
| EX. 12 | 1550 | 2 | 5 | 67 | A | 37 | A | 28 | A | A |
| EX. 13 | 1550 | 2 | 5 | 63 | A | 38 | A | 27 | A | A |
| EX. 14 | 1650 | 4 | 5 | 65 | A | 35 | A | 26 | A | A |
| EX. 15 | 1550 | 2 | 30 | 65 | A | 39 | A | 29 | A | A |
| EX. 16 | 1500 | 2 | 5 | 60 | A | 35 | A | 23 | A | A |
| EX. 17 | 1550 | 2 | 5 | 61 | A | 39 | A | 29 | A | A |
| EX. 18 | 1550 | 2 | 5 | 58 | O | 42 | O | 31 | O | O |
| EX. 19 | 1550 | 2 | 5 | 68 | A | 35 | A | 26 | A | A |
| EX. 20 | 1550 | 2 | 5 | 60 | A | 40 | A | 29 | A | A |
| EX. 21 | 1650 | 4 | 5 | 55 | O | 36 | A | 26 | A | A |
| EX. 22 | 1500 | 2 | 5 | 56 | O | 40 | A | 32 | O | A |
| EX. 23 | 1450 | 8 | 5 | 67 | A | 33 | A | 25 | A | A |
| EX. 24 | 1550 | 2 | 5 | 66 | A | 36 | A | 28 | A | A |
| EX. 25 | 1550 | 2 | 5 | 68 | A | 38 | A | 27 | A | A |
| EX. 26 | 1550 | 2 | 5 | 66 | A | 36 | A | 27 | A | A |
| EX. 27 | 1550 | 2 | 5 | 67 | A | 36 | A | 29 | A | A |
| EX. 28 | 1550 | 2 | 5 | 67 | A | 37 | A | 29 | A | A |
| EX. 29 | 1550 | 2 | 5 | 68 | A | 37 | A | 28 | A | A |
| EX. 30 | 1550 | 2 | 5 | 68 | A | 37 | A | 27 | A | A |
| EX. 31 | 1550 | 2 | 5 | 68 | A | 37 | A | 28 | A | A |
| EX. 32 | 1550 | 2 | 5 | 67 | A | 36 | A | 27 | A | A |
| EX. 33 | 1550 | 2 | 5 | 66 | A | 35 | A | 29 | A | A |
| EX. 34 | 1550 | 2 | 5 | 65 | A | 35 | A | 26 | A | A |
| EX. 35 | 1550 | 2 | 3 | 68 | A | 37 | A | 28 | A | A |
| EX. 36 | 1550 | 2 | 5 | 68 | A | 38 | A | 28 | A | A |

As is clear from TABLES 1 and 2, the alumina-based sintered members of the Examples falling within the scope of the scope of the present invention exhibited high withstand voltage even at a high temperature of 700° C., and a small percent strength drop after the acid resistance test or the base resistance test, indicating resistance to an acidic atmosphere and a basic atmosphere.

2. Production of Spark Plug

Similar to the aforementioned alumina-based sintered members, an insulator formed of a generally cylindrical alumina-based sintered material was produced. In the same manner, spark plugs were manufactured by use of the insulator. The thus-produced spark plugs exhibited excellent withstand voltage characteristics at high temperature and had resistance to an acidic atmosphere and a basic atmosphere.

DESCRIPTION OF REFERENCE NUMERALS

1 spark plug
2 center electrode
3 insulator
4 metallic shell
5 noble metal tip
6 ground electrode
9 screw portion
10 axial hole
G spark discharge gap

The invention claimed is:

1. A spark plug having an insulator containing an Al component, in terms of oxides, 89 mass % or more and a Ti component, in terms of oxides, more than 0 mass % and 0.2 mass % or less, characterized in that
   the insulator is formed of an alumina-based sintered material which contains, in a grain boundary phase present between alumina crystal grains, a first crystal phase containing at least one species selected from among an La component, an Nd component, a Pr component, a Y component, an Er component, a Yb component, and an Lu component, and a second crystal phase containing at least one species of Group 2 element components, the Group included in the periodic table defined by Recommendations 1990, IUPAC, an Al component, and an Si component.

2. A spark plug according to claim 1, wherein, when a cross section of the insulator is analyzed through X-ray diffractometry, the alumina crystal grains have a maximum diffraction peak height a, the first crystal phase has a maximum diffraction peak height b, and the second crystal phase has a maximum diffraction peak height c, wherein a, b, and c satisfy the following relationship (a):

$$0.025 \leq (b+c)/a \leq 0.12 \tag{a}$$

3. A spark plug according to claim 1, wherein the first crystal phase is $MgRE^1Al_{11}O_{19}$, $RE^1Al_{11}O_{18}$, $RE^2{}_2Si_2O_7$, $RE^2AlO_3$, and/or $RE^2{}_3Al_5O_{12}$ (wherein $RE^1$ represents at least one species selected from among La, Nd, and Pr; and $RE^2$ represents at least one species selected from among Y, Er, Yb, and Lu), and the second crystal phase is $CaAl_2Si_2O_8$.

4. A spark plug according to claim 1, wherein the insulator contains substantially no Na component or K component, or contains the Na component and the K component, in terms of oxides, 0.2 mass % or less in total.

* * * * *